(12) United States Patent
Schrom et al.

(10) Patent No.: US 7,199,617 B1
(45) Date of Patent: Apr. 3, 2007

(54) LEVEL SHIFTER

(75) Inventors: Gerhard Schrom, Hillsboro, OR (US); Dinesh Somasekhar, Hillsboro, OR (US); Peter Hazucha, Beaverton, OR (US); Stephen Tang, Beaverton, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 147 days.

(21) Appl. No.: 11/111,060

(22) Filed: Apr. 21, 2005

Related U.S. Application Data

(63) Continuation-in-part of application No. 10/987,278, filed on Nov. 12, 2004.

(51) Int. Cl.
H04K 19/094 (2006.01)
H04K 19/0175 (2006.01)

(52) U.S. Cl. ............... 326/86; 326/68; 327/109; 327/333

(58) Field of Classification Search ........... 326/63, 326/68, 80–83, 86; 327/108–109, 333
See application file for complete search history.

(56) References Cited

U.S. PATENT DOCUMENTS

| | | | |
|---|---|---|---|
| 3,975,671 A | 8/1976 | Stoll | |
| 5,821,800 A * | 10/1998 | Le et al. | 327/333 |
| 5,959,442 A | 9/1999 | Hallberg | |
| 5,969,542 A * | 10/1999 | Maley et al. | 326/81 |
| 6,002,290 A * | 12/1999 | Avery et al. | 327/333 |
| 6,518,818 B1 | 2/2003 | Hynes | |
| 6,556,047 B2 * | 4/2003 | Debaty | 326/68 |
| 6,639,427 B2 | 10/2003 | Dray et al. | |
| 6,642,769 B1 | 11/2003 | Chang et al. | |
| 6,693,469 B2 * | 2/2004 | Prodanov | 327/108 |
| 6,838,863 B2 | 1/2005 | Hazucha | |
| 6,947,328 B1 | 9/2005 | Smidt | |
| 2002/0011873 A1 | 1/2002 | Riccio et al. | |
| 2002/0175737 A1 | 11/2002 | Debaty | |
| 2002/0186058 A1 * | 12/2002 | Prodanov | 327/108 |
| 2003/0042965 A1 * | 3/2003 | Kanno et al. | 327/333 |
| 2003/0085418 A1 | 5/2003 | Hazucha | |
| 2003/0090252 A1 | 5/2003 | Hazucha | |
| 2003/0189443 A1 | 10/2003 | Kunz et al. | |
| 2004/0145919 A1 | 7/2004 | Hazucha | |
| 2005/0140415 A1 | 6/2005 | Hazucha | |

* cited by examiner

Primary Examiner—Rexford Barnie
Assistant Examiner—Jason Crawford
(74) Attorney, Agent, or Firm—Troutman Sanders LLP; James Hunt Yancey, Jr.

(57) ABSTRACT

A level shifting device comprises an input stage, a cascode stage, a cross-coupled stage, and an output stage. The input stage may receive a data signal or binary logic input in a first data range, a complement of the data signal, and a first voltage. The cascode stage may receive a first voltage and may be connected to the input stage. The cross-coupled stage may be adapted to isolate the first voltage and may be connected to the cascode stage. The output stage may receive a second voltage, provide an output, and be connected to the cross-coupled stage. The cascode stage may be adapted to provide the first voltage as the output when the logic input is a first value and provide the second voltage as the output when the logic input is a second value. Other embodiments are also claimed and described.

23 Claims, 5 Drawing Sheets

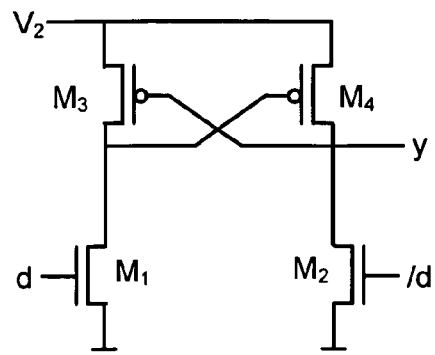
FIG. 1A
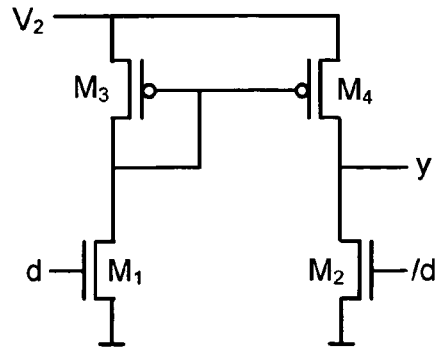
FIG. 1B
(Prior Art)
FIG. 1
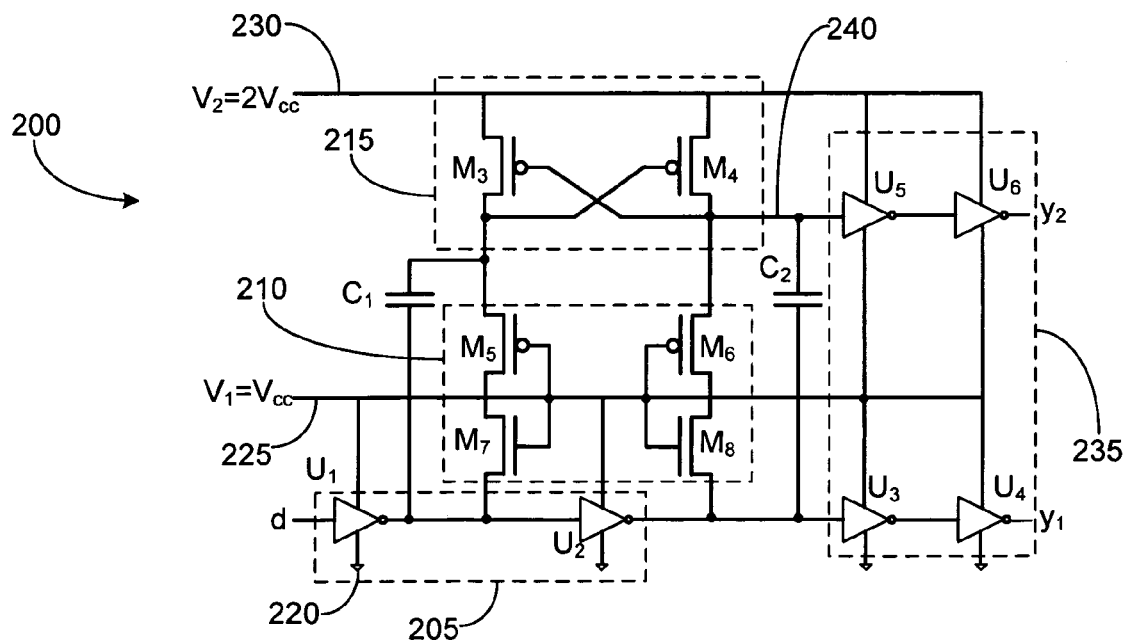
FIG. 2

LEVEL SHIFTER

CROSS-REFERENCE TO RELATED APPLICATION

This Application claims priority to and is a continuation-in-part of U.S. patent application Ser. No. 10/987,278 filed Nov. 12, 2004 and entitled, "Level Shifter," which is incorporated by reference in its entirety as if fully set forth herein.

BACKGROUND

As transistors continue to decrease in size, transistor density within electronic components continues to increase. While increases in transistor density provide many desirable effects, such as a reduction in component size and a reduction in power consumption, it may also create problems. Such problems may include increased power consumption, unwanted heat generation, and device reliability issues. Several methods have been devised to counter these problems so that transistor density may continue to increase without creating undesirable side effects. One such method is utilizing level shifter circuits.

Level shifter circuits may enable different digital logic components to operate at different power supply voltages. Operating in different logic voltage ranges serves to increase device reliability, decrease power consumption, and lower excess heat generation by providing specific voltage ranges to specific digital logic components. By limiting specific components to specific operating voltages, power consumption and heat generation may be easier to control and device reliability may be increased. Utilizing different logic voltages also presents significant problems as a digital high or low for one digital logic component may not have the same voltage values for another digital logic component. Therefore, it may be difficult or even impossible for components with different voltages to operate together. Level shifter circuits may serve as interfaces (or voltage translators or converters) between different logic device components to shift the voltage level of one component to an appropriate level of a second component to ensure adequate coherence between the voltage levels of the two components.

Level shifter circuits typically take one voltage value and shift it to a second voltage value. Level shifters can shift both up and down, and examples are depicted in FIGS. 1A and 1B. The level shifter circuit in FIG. 1A only utilizes cross-coupled P-type devices to shift an incoming digital signal, d, to a higher logic voltage range at output y. The level shifter circuit depicted in FIG. 1B utilizes a current mirror configuration to shift an incoming data signal, d, to a higher data range at output y. These sample level shifter circuits are capable of translating a digital logic signal with a small amplitude to a full-swing digital signal, but are limited in their capabilities. These circuits, however, are limited in their capabilities. For example, they are not capable of shifting to one or more other power supply voltage levels or supporting voltages higher than a base power supply level while utilizing transistors rated only for the base power supply level.

What is needed, therefore, is a level shifter circuit that can translate a digital logic signal from one power supply level to one or more power supply levels while only utilizing transistors rated for the base power supply level. What is also needed is a level shifter capable of shifting an input logic signal to various voltage ranges wherein the various voltage ranges are multiples (or divisors) of a base power supply voltage and supporting high voltages that are multiples of the base power supply while utilizing transistors rated for only the base power supply.

BRIEF DESCRIPTION OF DRAWINGS

FIGS. 1A and 1B, collectively known as FIG. 1, illustrate two representations of prior art level shifter circuits.

FIG. 2 illustrates a schematic representation of a shift-up level shifter in accordance with some embodiments of the present invention.

DETAILED DESCRIPTION

Figure 3:
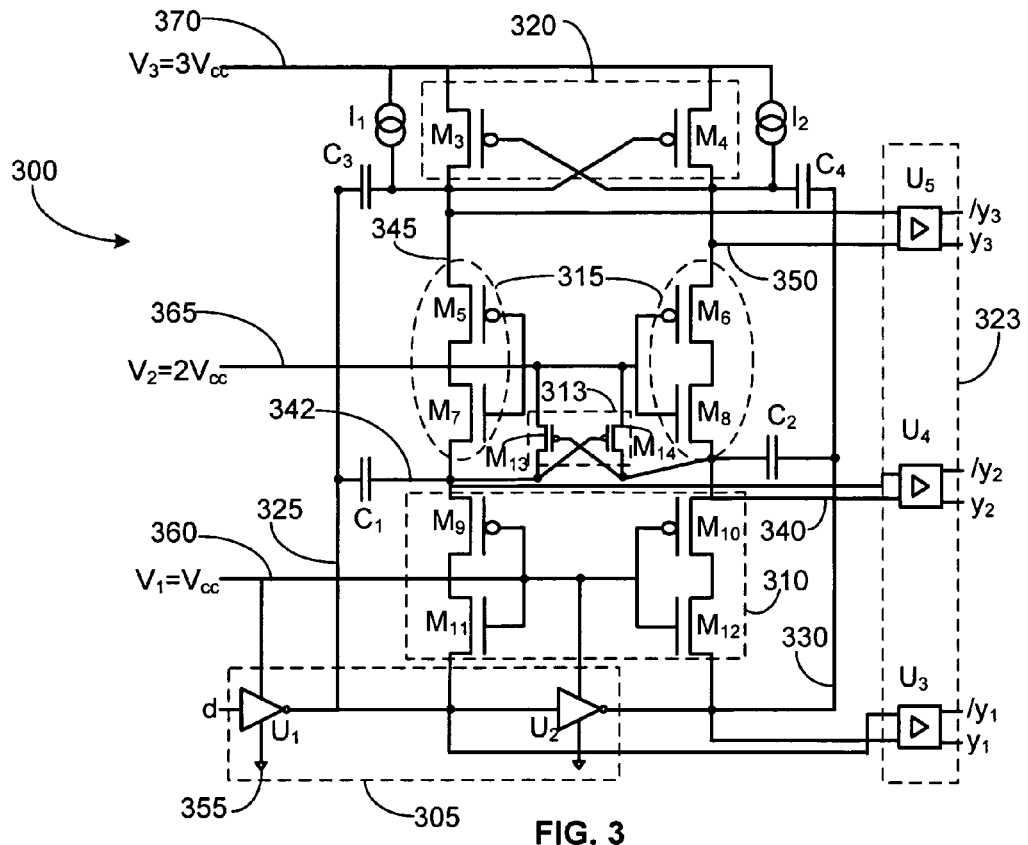
FIG. 3 illustrates a schematic representation of a shift-up level shifter in accordance with some embodiments of the present invention.

The various embodiments of the present invention may provide level shifting devices, systems, and methods capable of shifting a first voltage in a first data voltage range to a second voltage in a second data voltage range. For example, some embodiments may take a digital logic input in a first logic voltage range and provide an output in a second logic voltage range. Some embodiments of the invention may be utilized in applications where multiples of a base power supply voltage, $V_{cc}$, bound multiple data voltage ranges. Additionally, some embodiments of the present invention may generate multiple level-shifted outputs from a single digital logic input for a logic device so that power consumption and heat energy are reduced. Other embodiments of the present invention may provide a device and method for shifting an input signal operating in a first voltage range to an output signal operating in other voltage ranges while utilizing transistors only rated to withstand the supply voltage. These features may enable a level shifter system to efficiently and effectively shift a data input signal to predetermined voltage ranges. Some embodiments may also be utilized as voltage converters.

Referring now to the figures, FIG. 2 illustrates a schematic representation of an embodiment of a level shifter circuit 200 according to some embodiments of the present invention. Level shifter circuit 200 generally includes an input stage 205, a cascode stage 210, an output stage 215, and a buffer stage 235, each of which may contain one or more transistors. For purposes of this application, the transistors described in this application may be metal oxide semiconductor (MOS) transistors, which contain a drain, a source, and a gate. However, those skilled in the art will appreciate that other transistors may be used without departing from the scope of the invention.

Input stage 205 may receive a data signal, d, and a reference voltage 220. Data signal d may be a digital logic signal corresponding to a first digital logic voltage range. For example, data signal d may vary between the reference voltage 220 and a power supply voltage 225. Specifically data signal d may represent a binary logic signal having a "high" state that is represented by a range of voltage values centered around a power supply voltage 225 and a "low" state that may be represented by a range of voltage values centered around a reference voltage 220. Reference voltage 220 may be connected to ground, or alternatively, may have some value above ground. An on- or off-chip power supply may provide the reference voltage 220 and the power supply voltage 225.

Input stage 205 may comprise inverters $U_1$ and $U_2$, which may be connected to the reference voltage 220. Inverter $U_1$ may receive data signal d as its input and may provide a complement of the data signal as its output. The output of inverter $U_1$ may be connected to the input of $U_2$ and $U_1$ may provide the complement of the data signal /d to $U_2$. Input stage 205 may be connected to cascode stage 210 and may provide the data signal d and the complement of the data signal /d to cascode stage 210. More specifically, the output of inverter $U_1$ may be connected to the source of $M_7$ to provide the complement of the data signal to $M_7$, and the output of inverter $U_2$ may be connected to the source of $M_8$ to provide the data signal d to $M_8$. Input stage 205 may also be connected to buffer stage 235 and the inverter $U_2$ may provide the buffer stage 235 with data signal d.

Cascode stage 210 may contain a first cascode having transistors $M_5$ and $M_7$ and a second cascode having transistors $M_6$ and $M_8$. In some embodiments, transistors $M_5$ and $M_6$ may be p-type MOS (PMOS) transistors, while transistors $M_7$ and $M_8$ may be n-type MOS (NMOS) transistors. The data signal d and the complement of the data signal /d from input stage 205 and the power supply voltage 225 may be provided to the cascode stage 210. In some embodiments, the power supply voltage 225 may be approximately equal to a supply voltage, $V_{cc}$, and provided to the cascode stage 210 by either an on- or off-chip voltage source. In some embodiments the first cascode containing transistors $M_5$ and $M_7$ may be configured such that the source of $M_7$ may be connected to the output of inverter $U_1$, the gate of $M_5$ and $M_7$ may be connected to the power supply voltage 225, the drain of $M_5$ and $M_7$ may be connected together, and the source of $M_5$ may be connected to the output stage 215. Similarly, in some embodiments, transistors $M_6$ and $M_8$ may be connected together so that the source of $M_8$ may be connected to the output of $U_2$, the gate of $M_6$ and $M_8$ may be connected to the power supply voltage 225, the drain of $M_6$ and $M_8$ may be connected together, and the source of $M_6$ may be connected to the output stage 215.

Output stage 215 may comprise a pair of cross-coupled transistors $M_3$ and $M_4$. Output stage 215 may be connected to the cascode stage 210 and the buffer stage 235, and may receive a second voltage 230. The second voltage 230 may be a multiple of the power supply voltage 225, such as $2V_{cc}$, in some embodiments. In the shift-up embodiments of the present invention, the second voltage 230 may be greater than the reference voltage 220 and the power supply voltage 225. Whereas in the shift-down embodiments, the second voltage 230 may be less than the reference voltage 220 and the power supply voltage 225. $M_3$ and $M_4$ may be either p-type or n-type MOS transistors. The source of $M_3$ and $M_4$ may be connected to the second voltage 230, the gate of $M_3$ may be connected to the drain of $M_4$, the gate of $M_4$ may be connected to the drain of $M_3$, and the drains of $M_3$ and $M_4$ may be connected to the sources of $M_5$ and $M_6$ as illustrated in FIG. 2. Output stage 220 may provide a level shifted output 240 at the drain of $M_4$ and level shifted output 240 may be provided to the buffer stage 235.

The buffer stage 235 may contain inverters $U_3$, $U_4$, $U_5$, and $U_6$. The buffer stage 235 may be connected to the input stage 205, the cascode stage 210, and the output stage 230. The buffer stage 235 may also be connected to the reference voltage 220, the power supply voltage 225, and the second voltage 230. The buffer stage 235 may receive the data signal d from the input stage 205 and may receive a level shifted output 240 from the cascode stage 210 or output stage 230. The buffer stage 235 may be adapted to provide a shifted ($y_2$) and an un-shifted ($y_1$) version of the logical input data signal d with matched delay. For example, data signal d may be input to inverter $U_2$ and inverter $U_3$ may provide its output to inverter $U_4$. The output of $U_4$ ($y_1$) may be a delayed version of the data signal d. Also, inverter $U_5$ may receive output 240 from the drain of $M_4$ or the source of $M_6$, inverter $U_5$ may provide its output to inverter $U_6$, and the output of $U_6$ ($y_2$) may be a level shifted version of data signal d having approximately the same delay as output $y_1$.

Level shifter 200 may also include capacitors $C_1$ and $C_2$. Capacitor $C_1$ may be connected between the output of inverter $U_1$ and the source of $M_5$ such that capacitor $C_1$ may be in parallel with transistors $M_5$ and $M_7$ of the first cascode. Similarly, capacitor $C_2$ may be connected in parallel with transistors $M_6$ and $M_8$ such that $C_2$ is connected between the source of M6 and the output of inverter $U_2$. Generally, capacitors $C_1$ and $C_2$ may be sized so that their capacitances are approximately equal. For example, capacitors $C_1$ and $C_2$ may range from approximately twenty femtoFarads (fF) to approximately 100 femtoFarads (fF). In some embodiments, Capacitors $C_1$ and $C_2$ may be sized to be larger than the parasitic capacitance between the drain of transistor $M_4$ and a ground connection. Capacitors $C_1$ and $C_2$ may enable level shifter 200 to perform quick level shifting operations and also eliminate potential contention problems associated with transistors $M_3$ and $M_4$. In other words, capacitors $C_1$ and $C_2$ may enable the output of level shifter to transition faster when the input signal d transitions by limiting the contention current flow associated with transistors $M_3$ and $M_4$.

In operation, level shifter 200 may provide a level shifted output $y_2$ that represents input data signal d in a different data voltage range or digital logic range. Suppose, for example, that input signal d represents a logic value in a data voltage range bounded between 0 volts and $V_{cc}$, then level shifter 200 may translate (or convert) input signal d to a second data voltage range bounded by $V_{cc}$ and $2V_{cc}$ such that output $y_2$ is the level shifted output of the input signal d. The transistor cascodes $M_5$, $M_7$ and $M_6$, $M_8$ may enable level shifter 200 to operate in such a manner. For example in some embodiments, if data signal input d is a logical high, the source of $M_7$ and the gate of $M_5$ may be pulled to ground. This in turn may pull the source of $M_5$ up to $V_{cc}$ and bias M4 on, which results in an output at $y_2$ approximately equal to $2V_{cc}$. Additionally, a high data signal d input may turn transistor $M_3$ off. In an alternative example, if data input signal input d is a logical low transistor $M_8$ may be turned off, and transistor $M_6$ may be turned on pulling output $y_2$ to $V_{cc}+V_{gs}$ representing a logic low in the $V_{cc}$–$2V_{cc}$ data range. Capacitors $C_1$ and $C_2$ may enable level shifter 200 to quickly provide output $y_2$ in response to the transition of the data signal input, and may also effectively eliminate the contention problems associated with transistors $M_3$ and $M_4$ that may decrease the transition of the output $y_2$.

A feature of some embodiments of the present invention is that none of the transistors's gate-source voltage ($V_{gs}$) or drain-source voltage ($V_{ds}$) may exceed $V_{cc}$ at any time. For example, when the power supply voltage 225 is $V_{cc}$ and the second voltage 230 is $2V_{cc}$ the voltage potential across the transistors may never rise above $V_{cc}$. Thus, level shifter 200 may support voltage levels higher than $V_{cc}$ while only utilizing transistors rated to withstand $V_{cc}$. Some embodiments of the present invention may also provide a level shifter capable of shifting data signals from one data voltage range to another data voltage range where the data voltage range boundaries may be multiples of the power supply voltage 225. Other embodiments provide a level shifter circuit having data voltage ranges that may be bounded by predetermined or selected voltages such that the data voltage ranges may not have the same voltage range or may not be based on multiples of a power supply voltage. Level shifter 200 may also be used in on-die DC—DC converters.

Although level shifter 200 is a shift-up type level shifter, a complementary shift-down embodiment is also possible in accordance with some embodiments of the present invention. A shift-down embodiment of a level shifter according to the present invention may down shift a logic input from a first data voltage range to a second data voltage range. A shift-down embodiment has similar stages and construction as level shifter 200. A down shifter embodiment may consist of an output stage having n-type MOS transistors and the second voltage 230 may be connected to either a reference voltage or ground. Also, the power supply voltage 225 may be connected to a power supply voltage, $V_{cc}$, and the reference voltage 220 may be connected to a multiple of the power supply voltage such as $2V_{cc}$. In operation, a down shifter may have an input signal between $V_{cc}$ and $2V_{cc}$ and may provide a level shifted output between $V_{cc}$ and ground.

FIG. 3 illustrates a schematic representation of a multi-level shifter 300 capable of shifting an input signal to several different logic data voltage levels. Level shifter 300 is a two-tier level shifter and operates similarly to level shifter 200. Level shifter 300 may comprise multiple transistors which may be p-type or n-type MOS transistors. Level shifter 300 generally has an input stage 305, a first cascode stage 310 to provide a first level-shifted output 340, a cross-coupled stage 313, a second cascode stage 315 to provide a second level-shifted output 350, and an output stage 320. Level shifter 300 may also comprise a buffer stage 523, capacitors $C_1$–$C_4$, and current sources $I_1$ and $I_2$. The input stage 305 may be connected to the first cascode stage 310 and the buffer stage 323. The first cascode stage 310 may be connected to the cross-coupled stage 313, second cascode stage 315, and the buffer stage 323. The output stage 320 may be connected to the second cascode stage 315 and the buffer stage 323.

The input stage 305 may contain two inverters, $U_1$ and $U_2$, which may receive a logic input data signal, d, and may be connected to a reference voltage 355. Inverters $U_1$ and $U_2$ may be connected in series such that $U_1$ provides its output to the input of $U_2$. Input stage 305 may provide two signals 330, 332 from $U_1$ and $U_2$, respectively, to other components of level shifter 300. Signal 330 may be a complement of logic input data signal d and signal 332 may be a complement of signal 332 or approximately equal to logic input signal d. For example, $U_1$ may provide the complement of signal 332, which is the complement of data signal d, to capacitors $C_1$, $C_3$, the source of $M_{11}$, and the buffer stage 323. Also, $U_2$ may provide signal 330, which is the input signal d, to capacitors $C_2$, $C_4$, the source of $M_{12}$, and buffer stage 323.

Cascode stage 310 may comprise a first cascode containing transistors $M_9$ and $M_{11}$, and a second cascode containing transistors $M_{10}$ and $M_{12}$. Transistors $M_9$, $M_{10}$, $M_{11}$, and $M_{12}$ may be p-type or n-type MOS transistors. Cascode stage 310 may be connected to a first voltage 360 such as $V_{cc}$. As can be seen, cascode stage 310 may be similar to cascode stage 210 in level shifter 200 and may operate in the same manner. For example, the source of $M_{11}$ may be connected to the output of inverter $U_1$, the gate of $M_9$ and $M_{11}$ may be connected to first voltage 360, the drain of $M_9$ and $M_{11}$ may be connected together, and the source of $M_9$ may be connected to the second cascode stage 315. Additionally, transistors $M_{10}$ and $M_{12}$ may be connected such that the output of $U_2$ may be connected to the source of $M_{12}$, the gate of both $M_{10}$ and $M_{12}$ may be connected to the first voltage 360, the drain of $M_{10}$ and $M_{12}$ may be connected together, and the source of $M_{10}$ may be connected to the second cascode stage 315.

The second cascode stage 315 may be connected in a similar manner as the first cascode stage 310. The second cascode stage 315 may contain a third cascode having transistors $M_5$ and $M_7$ and a fourth cascode having transistors $M_6$ and $M_8$. The source of $M_7$ may be connected to the source of $M_9$, the gate of $M_5$ and $M_7$ may be connected to a second voltage 365, the drain of $M_5$ and $M_7$ may be connected together, and the source of $M_5$ may be connected to the output stage 320. Additionally, in some embodiments, transistors $M_6$ and $M_8$ may be connected such that the source of $M_8$ may be connected to the source of $M_{10}$, the gate of $M_6$ and $M_8$ may be connected to the second voltage 365, the drain of $M_6$ and $M_8$ may be connected together, and the source of $M_6$ may be connected to the output stage 320. The second cascode stage may be similar to cascode stage 210 in level shifter 200 and may operate in the same manner.

The cascode stages 310 or 315 may provide a first output 340 or a second output 342 to buffer stage 323 depending on input signal, d. For example, if input signal, d, has a value equivalent to a logical high, then the source of $M_8$ may output $2V_{cc}$ as the first output 340 and the source of $M_9$ may output $V_{cc}$ as the second output 342. In an alternative example, if input signal, d, has a value equivalent to a logical low, the source of $M_{10}$ may provide $V_{cc}$ as the first output 340 and the source of $M_7$ may provide $2V_{cc}$ as the second output 342.

Cross-coupled stage 313 may also be utilized in level shifter 300 to control the output impedance of level shifter 300. The cross coupled stage 313 may contain two p-type or n-type transistors $M_{13}$, $M_{14}$. Cross-coupled stage 313 may be connected to the second cascode stage 315 in some embodiments. Specifically, the source of $M_{13}$ and $M_{14}$ may be connected to the second voltage 365, the gate of $M_{13}$ may be connected to the drain of $M_{14}$, the gate of $M_{14}$ may be connected to the drain of $M_{13}$. The drain of $M_{13}$ may be connected to the drain of $M_7$ and the drain of $M_{14}$ may be connected to the drain of $M_8$. Transistors $M_{13}$ and $M_{14}$ control the output impedance of level shifter 300 so that the output impedance of level shifter 300 does not exceed a predetermined external impedance or operates in a predetermined impedance range.

Output stage 320 may contain two transistors $M_3$, $M_4$. Transistors $M_3$, $M_4$ may be p-type transistors in up-shift level shifter embodiments and may be n-type transistors in down-shift level shifter embodiments. Output stage 320 may be connected to a third voltage 370 and the second cascode stage 315. Specifically, the source of $M_3$ and $M_4$ may be connected to the third voltage 370, the gate of $M_3$ may be connected to the drain of $M_4$, the gate of $M_4$ may be connected to the drain of $M_3$, the drain of $M_3$ may be connected to the source of $M_5$, and the drain of $M_4$ may be connected to the source of $M_6$ in the second cascode stage 315.

The second cascode stage 315 or output stage 320 may provide various level shifted outputs. For example, if input signal d is a logical high, then the drain of $M_4$ may output $3V_{cc}$ as a third output 350 and the source of $M_5$ may output $2V_{cc}$ as a fourth output 345. In an alternative example, if input d is a logical low, the source of $M_6$ may provide $2V_{cc}$ as the third output 350 and the drain of $M_3$ may provide $2V_{cc}$ as the fourth output 345.

Buffer stage 323 may also be used in some embodiments of the present invention to provide buffered outputs. Buffered outputs may enable some embodiments of the present invention to provide stable voltage outputs. Buffer stage 323 may consist of individual differential buffers $U_3$, $U_4$, and $U_5$. Differential buffers $U_3$, $U_4$, and $U_5$ may be connected to the input stage 305, first cascode stage 310, second cascode stage 315, and output stage 320. Differential buffer $U_3$ may be connected to the output of inverters of $U_1$ and $U_2$ and may provide buffered outputs $y_1$ and $/y_1$. Differential buffer $U_4$ may be connected to the source of $M_9$ and $M_{10}$ to receive a first level shifted signal and may provide buffered outputs $y_2$ and $/y_2$ of the first level shifted signal. Differential buffer $U_5$ may be connected to the source of $M_5$ and $M_6$ to receive a first level shifted signal and may provide buffered outputs $y_3$ and $/y_3$ of the first level shifted signal. Differential buffers $U_3$, $U_4$, and $U_5$ may make the level shifter 300 robust against output voltage swings. The buffers $U_3$, $U_4$, and $U_5$ may consist of NMOS or PMOS devices, and may contain an array of inverters as shown in FIG. 4.

Figure 4:
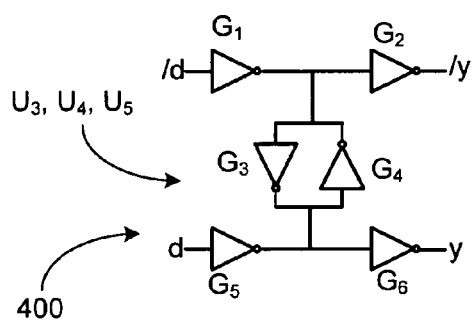
FIG. 4 illustrates a schematic representation of a differential output buffer utilized in some embodiments of the present invention.

FIG. 4 illustrates a schematic representation of a differential output buffer 400 utilized in some embodiments of the present invention. In some embodiments, multiple differential output buffers 400 may be used in buffer stage 323 for differential buffers $U_3$, $U_4$, and $U_5$. The differential output buffer 400 may contain six inverters $G_1$–$G_6$ each having an input and an output. Inverters $G_1$ and $G_5$ may receive input signals d and /d, respectively. And inverters $G_2$ and $G_6$ may provide outputs y and /y, respectively. Inverter $G_1$ may be connected to the input of inverter $G_2$, and the output of inverter $G_5$ may be connected to the input of inverter $G_6$. The input of inverter $G_3$ may be connected to the output of inverter $G_1$ and the output of inverter $G_3$ may be connected to the input of inverter $G_6$. The input of inverter $G_4$ may be connected to the output of inverter $G_5$, and the output of inverter $G_4$ may be connected to the input of inverter $G_2$. Inverters $G_1$ and $G_5$ may have trip points that are higher than standard inverters, while inverters $G_2$ and $G_6$ may have trip points that are lower than standard inverters. Such trip points may ensure that only a strong input signals (d and /d) change the output of the buffer serving to increase the noise immunity for voltage converter 300.

Level shifter 300 may also contain capacitors $C_1$, $C_2$, $C_3$, and $C_4$. Capacitors $C_1$, $C_2$, $C_3$, and $C_4$ may enable level shifter 300 to provide quick level shifted outputs by increasing the response time of level shifter 300. This may enable level shifter 300 to respond quickly to a transitioning logic input signal d. Capacitors $C_1$ and $C_2$ may be connected between the input stage 305 and the first cascode stage 310. Capacitors $C_3$ and $C_4$ may be connected between capacitors $C_1$ and $C_2$, and the second cascode stage 315.

Level shifter 300 may also contain current sources (or injectors) $I_1$ and $I_2$. Current sources $I_1$ and $I_2$ may be connected in parallel with output stage 320 between the third voltage 370 and the second cascode stage 315. Current sources $I_1$ and $I_2$ may provide current to counteract any current leakage problems which may occur between the source and drain of the transistors composing level shifter 300. In some embodiments current sources $I_1$ and $I_2$ may be implemented with one or more current injectors or other current sources.

Figure 5:
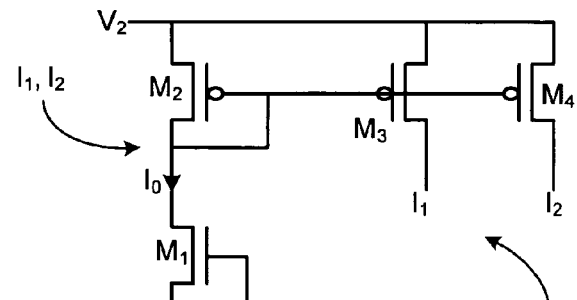
FIG. 5 illustrates a schematic representation of a current injector in accordance with some embodiments of the present invention.

FIG. 5 illustrates a schematic representation of a current injector 500 utilized in some embodiments of the present invention. The current injector 500 may provide currents $I_1$ and $I_2$ and may be connected in parallel to output stage 320. Currents $I_1$ and $I_2$ are so labeled in output stage 320. The current injector 500 may contain transistors $M_1$, $M_2$, $M_3$, and $M_4$ each having a source, a gate, and a drain. $M_1$ may be an n-type MOS transistor, and $M_2$, $M_3$, and $M_4$ may be p-type MOS transistors. The source and gate of $M_1$ may be connected to the first voltage 360 and the drain of $M_1$ may be connected to the drain and the gate of $M_2$. The source of $M_2$, $M_3$, and $M_4$ may be connected to the second voltage 365, while the gate of $M_2$ may be connected to the gate of $M_3$ and $M_4$. The drains of $M_3$ and $M_4$ may provide currents $I_1$ and $I_2$ which may mirror the junction leakage current, $I_0$, of $M_1$. In some embodiments, the current injector 500 may be sized so that the injected current ($I_1$ and $I_2$) is a multiple of the highest likely total junction current in a level shifter utilizing cascode stages.

Level shifter 300 may receive various signals and be connected to various voltages. The input stage may receive digital logic input d may be connected to a reference voltage 355 and the first voltage 360, and may provide outputs $y_1$ and $/y_1$. The first cascode stage 310 may be connected to the first voltage 360 and provide outputs $y_1$, $/y_1$, $y_2$ and $/y_2$. The second cascode stage 315 may be connected to the second voltage 365 and provide outputs $y_2$, $/y_2$, $y_3$ and $/y_3$. And the output stage may be connected to the third voltage 370 and may also provide outputs $y_3$ and $/y_3$.

The outputs provided by the buffer stage 323 of the level shifter 300 may depend on the digital logic input d as discussed above. Outputs $y_1$ and $/y_1$ may be un-shifted buffered versions of logical input d and complement logical input signal /d. Outputs $y_2$ and $/y_2$ may be buffered shifted versions of logical input d and its complement /d, and may be bounded by the first voltage 560 and the second voltage 565. Similarly, outputs $y_3$ and $/y_3$ may be buffered shifted versions of logical input d and its complement /d, and may be shifted into a voltage range that may be bounded by the second voltage 565 and the third voltage 570. For example, if logical input d is a logical high then output $y_1$ may be approximately equal to the first voltage 360, output $y_2$ may be approximately equal to the second voltage 365, and output $y_3$ may be approximately equal to the third voltage 370. Additionally, output $/y_1$ may be approximately equal to the reference voltage, output $y_2$ may be approximately equal to the first voltage 360, and output $y_3$ may be approximately equal to the second voltage 365. If logical input d is a logical low, then output $y_1$ may be approximately equal to the reference voltage, output $y_2$ may be approximately equal to the first voltage 360, and output $y_3$ may be approximately equal to the second voltage 365. Additionally, output $y_1$ may be approximately equal to the first voltage 360, $y_2$ may be approximately equal to the second voltage 365, and output $y_3$ may be approximately equal to the third voltage 370.

The voltages provided to the level shifter may vary in the various embodiments of the present invention. The reference voltage 355 may be a reference voltage such as ground. The second voltage 365 and the third voltage 370 may be multiples of the first voltage 360 in shift-up embodiments. Alternatively in shift-down embodiments, the first voltage 360 and the second voltage 365 may be multiples of the third voltage 370. The first voltage 360 may be a supply voltage, having a predefined value above the reference voltage 355. The second voltage 365 and the third voltage 370 each may have values that are a multiple of the first voltage 360, and may be supplied by the same power supply supplying the first voltage 360. For example, the reference voltage 355 may be connected to ground, the first voltage 360 may be approximately 1 volt, the second voltage 365 may be approximately 2 volts, and the third voltage 370 may be approximately 3 volts.

In operation, level shifter 300 may provide multiple level shifted outputs. For example, when the logical input, d, is a digital high (d=1), output $y_2$ may approximately equal $2V_{cc}$ and output $y_3$ may approximately equal $3V_{cc}$. When logical input d is a logical high, the input stage 305 may provide d and /d to $U_3$, output $y_1$ may be approximately equal to the value of the logic input d, and output $/y_1$ may be approximately equal to the complement input signal /d. The source of $M_8$ may be pulled to $2V_{cc}$ and the source of $M_9$ may be pulled down to $V_{cc}$. These values may then be provided to differential buffer $U_4$, and output $y_2$ may be approximately $2V_{cc}$ and output $/y_2$ may be approximately $V_{cc}$. Also when logical input d is a logical high, the source of $M_9$ may be pulled to $2V_{cc}$ and the drain of $M_4$ may be pulled to $3V_{cc}$. These values may then be provided to differential buffer $U_5$, and output $y_3$ approximately may equal $3V_{cc}$ and output $/y_3$ may approximately equal $2V_{cc}$. In an alternative example, if data signal input is a logical low (d=0) output $y_1$ may approximately equal the reference voltage 355, output $y_2$ may approximately equal $V_{cc}$, and output $y_3$ may approximately equal $2V_{cc}$. Additionally, the source of $M_{10}$ may be pulled to $V_{cc}$, the drain of $M_7$ may be pulled to $2V_{cc}$, the source of $M_6$ may be pulled to $2V_{cc}$, and the drain of $M_3$ may be pulled to $3V_{cc}$.

In other embodiments of the present invention, additional cascode stages may be added such that some embodiments of the present invention may be capable of shifting an input signal to a plurality of different data voltage ranges, limited only by the junction breakdown of the cascode transistor pairs. This feature of some embodiments of the present invention may enable level shifters to translate an input signal from a lower voltage data range to a higher voltage data range where voltage data ranges are bounded by multiples of a base power supply voltage such as $V_{cc}$ or other voltages. For example if input signal d=1 (and its complement /d=0) in a first data voltage range bounded by the reference voltage 355 and the first voltage 360, then output $y_2$ may equal a logic high in a second data voltage range bounded by the first voltage 360 and the second voltage 365, and output $y_3$ may equal a logic high in a third voltage range bounded by the second voltage 365 and the third voltage 370. Level shifter 300 may also be used as a voltage converter in some embodiments capable of shifting an input voltage (d) to one or more higher or lower output voltages.

Figure 6:
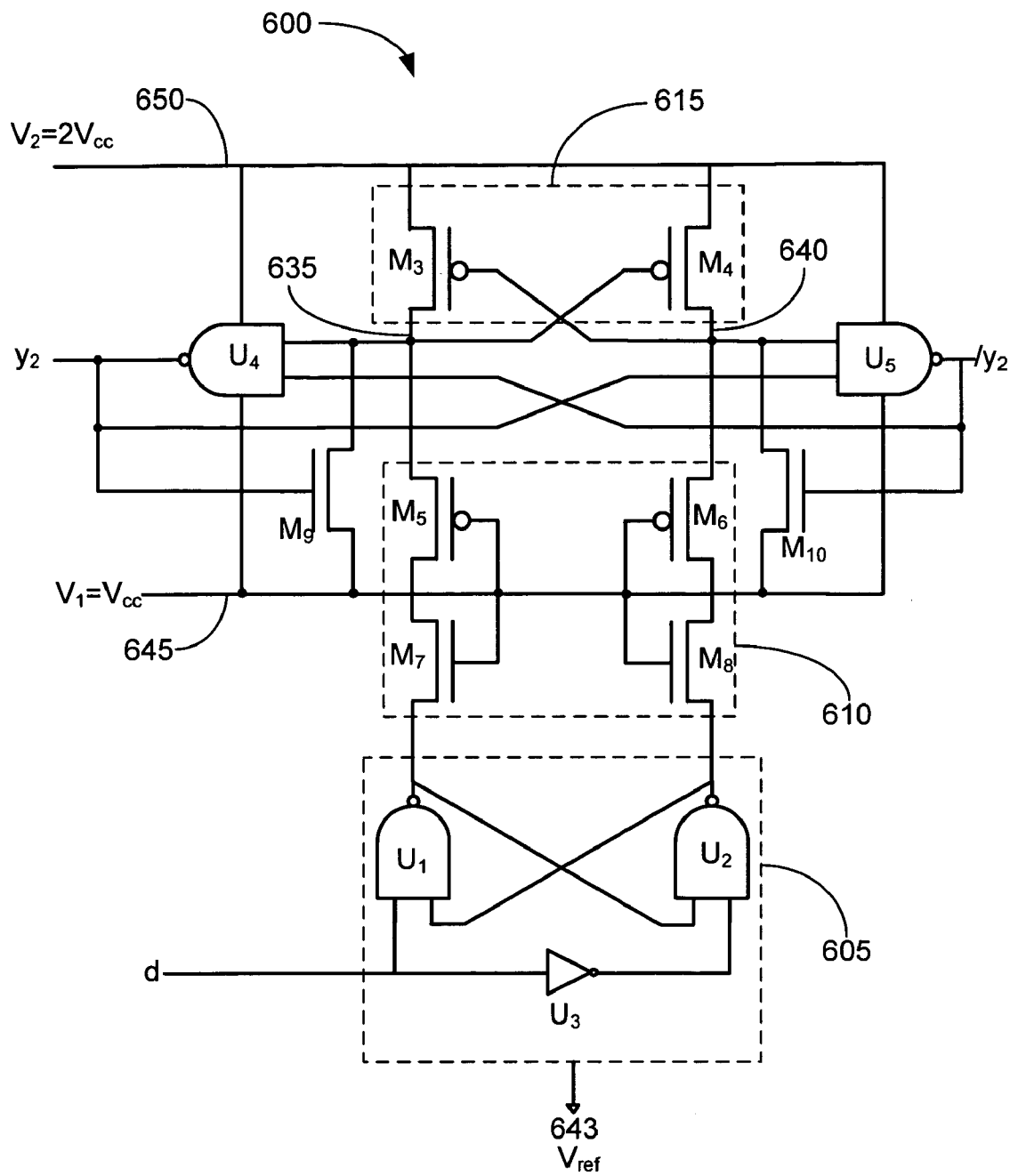
FIG. 6 illustrates a schematic representation of a level shifter utilizing logic gates in accordance with some embodiments of the present invention.

FIG. 6 illustrates a schematic representation of yet another embodiment of a level shifter 600. Level shifter 600 may contain input stage 605, cascode stage 610, and output stage 615. Cascode stage 610 may include transistors $M_5$, $M_6$, $M_7$ and $M_8$, and output stage 615 may include transistors $M_3$ and $M_4$. The transistors of cascode stage 610 and output stage 615 may be connected similarly and have similar operating characteristics to those transistors discussed in level shifter 200. Level shifter 600 may be connected to a reference voltage 643 ($V_{ref}$), a first voltage 645 ($V_1$), and a second voltage 650 ($V_2$). The reference voltage 643 may be connected to ground, and the first voltage 645 and the second voltage 650 may be provided by an on- or off-die power supply. In some embodiments, the first voltage 645 may be $V_{cc}$, a base power supply voltage; and the second voltage 650 may be $2V_{cc}$, or a multiple of $V_{cc}$. Level shifter 600 may also include transistors $M_9$ and $M_{10}$, and logic gates $U_1$–$U_5$. The addition of these components to level shifter 600 may provide a level shifter capable of controlling the contention problems associated with transistors $M_3$ and $M_4$ by ensuring that the drains of $M_3$ and $M_4$ are pulled to the first voltage ($V_1$) quickly.

Input stage 605 may comprise a first NAND gate $U_1$, a second NAND gate $U_2$, and inverter $U_3$. NAND gates $U_1$ and $U_2$ may have two inputs and one output, and may form an RS flip flop. Other logic gate types may also be used in some embodiments. The first NAND gate $U_1$ may receive a logic input data signal d, at one input and the output of $U_2$ as the other input. NAND gate $U_2$ may receive the complement /d, of logic input d from inverter $U_3$ at one input and may receive the output of $U_1$ for its other input. The output of the first NAND gate $U_1$ and the second NAND gate $U_2$ may also be provided as inputs to cascode stage 610. Specifically, the output of $U_1$ may be connected to the source of $M_7$ and the output of $U_2$ may be connected to the source of $M_8$.

Transistors $M_9$, $M_{10}$, and NAND gates $U_4$, $U_5$ may be connected between the cascode stage 610 and the output stage 615. Specifically, the gate of $M_9$ may be connected to the output of NAND gate $U_4$, the source of $M_9$ may be connected to the first voltage 645, and the drain of $M_9$ may be connected to the output stage 615 through the drain of $M_3$. NAND gate $U_4$ may have its inputs connected to the output of NAND gate $U_5$ and to output stage 615 through the drain of $M_3$. The output of $U_4$ may provide level shifted output $y_2$. The source of $M_{10}$ may be connected to the first voltage 645, the gate of $M_{10}$ may be connected to the output of $U_5$, and the drain of $M_{10}$ may be connected to the output stage 615 via the drain of $M_4$. NAND gate $U_5$ may have its inputs connected to the output of NAND gate $U_4$ and output stage 615 through the drain of $M_4$. The output of NAND gate $U_5$ may provide the complement $/y_2$ of the level shifted output $y_2$. NAND gates $U_4$ and $U_5$ may be connected to form an RS flip flop in some embodiments.

In operation, level shifter 600 may provide a level shifted output $y_2$ and a complement of the level shifted output $/y_2$. When input d is a logical high, output $y_2$ may be provided as $2V_{cc}$ (or twice the first voltage 645) and output $/y_2$ may be provided as $V_{cc}$. Conversely, when input d is a logical low, output $y_2$ may be provided as $V_{cc}$, and output $/y_2$ may be provided as $2V_{cc}$. Level shifter 600 may function similarly to the above discussed level shifters and the addition of logic gates $U_1$–$U_5$ and transistors $M_9$ and $M_{10}$ may reduce the contention problems which may arise through use of transistors $M_3$ and $M_4$. Level shifter 600 may also be utilized as a voltage converter in some embodiments or utilized as part of a high-voltage driver in memory programming circuits.

Figure 7:
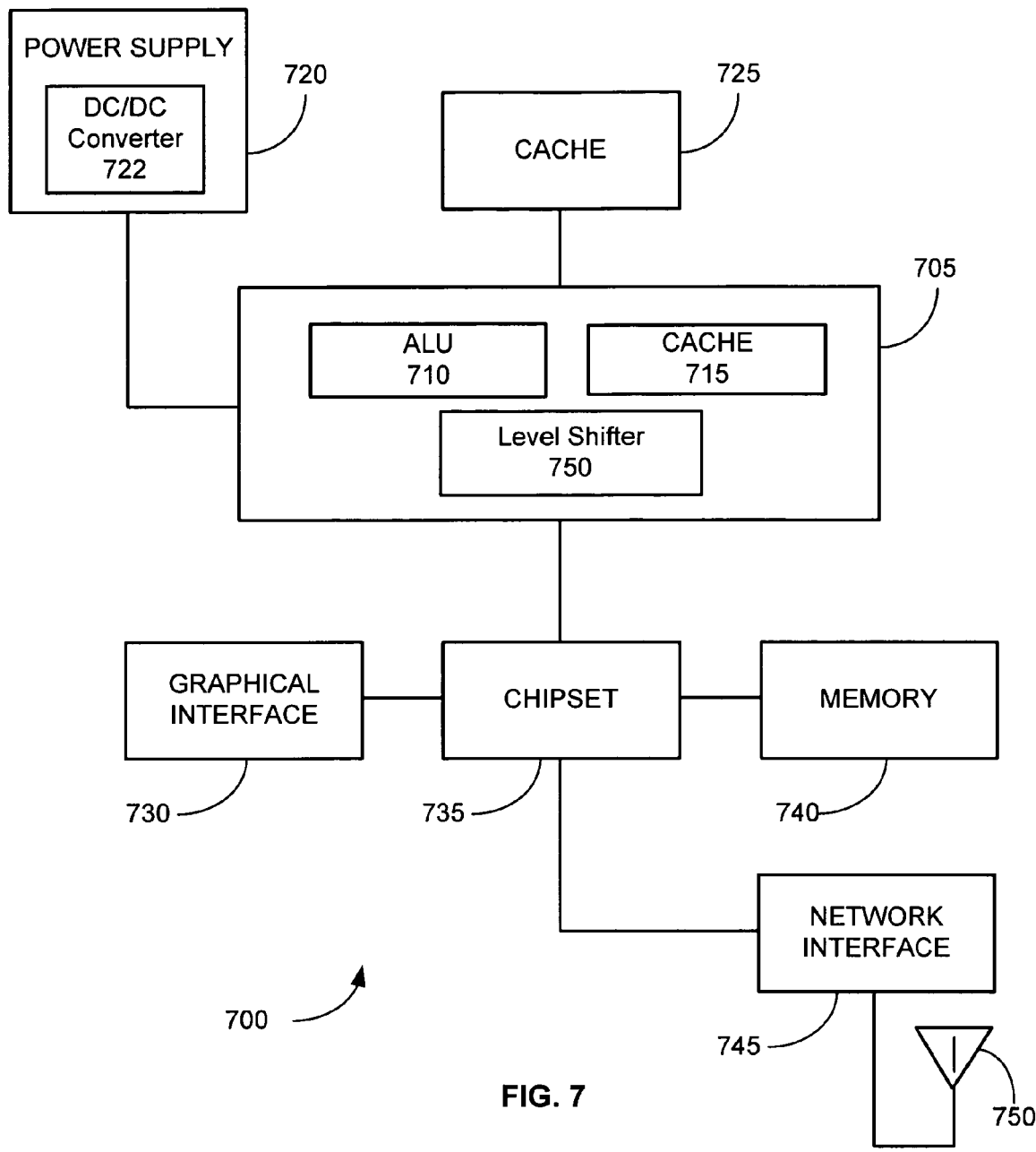
FIG. 7 illustrates a block diagram of a system employing a level shifter in accordance with some embodiments of the present invention.

FIG. 7 illustrates a block diagram of a system embodiment of the present invention. As shown, system 700 may comprise logic device components including processor 705, ALU 710, caches 715, 725, and power supply 720. System 700 may further comprise graphical interface 730, chipset 735, memory 740, and a network interface 745 all of which may be connected to processor 705 by a network data bus or wireless communication system. System 700 may comprise other logic device components capable of receiving binary logic or digital logic inputs. Processor 705 may include a level shifter 750 to shift a logic input from one digital voltage range to another digital voltage range, and a power supply to provide multiple voltages to bound multiple digital voltage ranges.

In some embodiments, the power supply 720 may produce voltages that are multiples of a base voltage. For example, for a base voltage of $V_{cc}$, power supply 720 may produce multiples of $2V_{cc}$, $3V_{cc}$, $5V_{cc}$, etc., which may define the voltage ranges used to define the logical "high" and logical "low" data signals for different device components. In other embodiments, power supply 720 may produce other voltages to bound multiple data voltage ranges that do not have substantially equal voltage ranges or are not multiples. For example, a first voltage data range may be bounded by 0 volts and 1.2 volts, a second voltage data range may be bounded by 1.5 volts and 2.0 volts, and a third voltage data range may be bounded by 2.0 volts and 3.5 volts. Also, in some embodiments, the power supply 720 may include a voltage converter such as DC/DC converter 722. Additionally, the DC/DC converter 722 can comprise a level shifter as contemplated by the various embodiments of the present invention to convert or shift an input DC voltage to an output DC voltage.

In other system embodiments of the present invention, more than one component may comprise a level shifter. For example, system 700 may comprise a flash memory 740, and the flash memory may have a level shifter to receive data signals and shift the data signals so that the flash memory can receive and transmit data in the correct data range or ranges. In an alternative embodiment, the data bus of the system 700 may be equipped with at least one level shifter according to the various embodiments of the present invention ensuring that it transmits and receives data in the correct data range or ranges. Still yet other embodiments of the present invention may be utilized in on- or off-die DC—DC converters or high voltage drivers in non-volatile (Flash) memory programming circuits. The various embodiments of the present invention may also comprise a network interface such as a wireless interface so that a system embodiment may be incorporated into a wireless device such as cell phone or personal digital assistant. As illustrated in FIG. 7, system 700 may also include an antenna 750 coupled to network interface 745 that is capable of receiving and transmitting wireless signals. The network interface may include a wireless interface such as a wireless transceiver enabling system 700 to receive and transmit wireless information.

Figure 8:
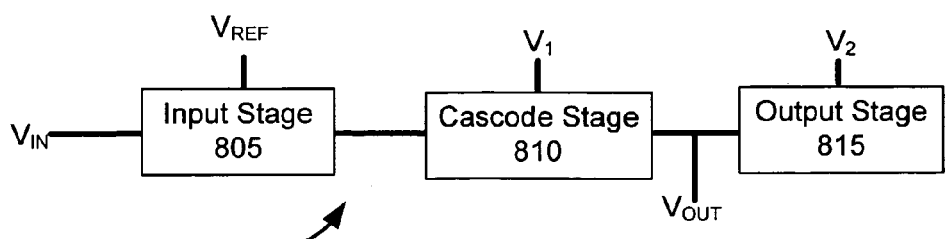
FIG. 8 illustrates a block diagram of a voltage converting device according to some embodiments of the present invention.

In yet other system embodiments, power supplies or DC—DC converters may utilize one or more embodiments of the present invention. For example, a DC—DC converter may have one or more inputs and outputs and may convert one or more of the inputs to a predetermined voltage and provide the one or more converted voltages as outputs. For example, consider a voltage converter 800 depicted in FIG. 8 in accordance with some embodiments of the present invention. Generally, the voltage converter 800 may comprise input stage 805, cascode stage 810, and output stage 815. These stages may be similar to the input stages, cascode stages, and output stages discussed above. For example, input stage 805 may be implemented with input stage 205, cascode stage 810 may implemented with cascode stage 210, and output stage 815 may be implemented with output stage 215. Additionally, the voltage converter 800 may comprise additional stages and components such as buffer stage 235 and booster capacitors. Those skilled in the art will understand and appreciate that the various embodiments of the present invention may be utilized as DC—DC voltage converters, and that the voltage converter 800 may be implemented with the various embodiments of the present invention.

Voltage converter 800 may receive a voltage input ($V_{IN}$), a reference voltage ($V_{REF}$), a first voltage ($V_1$), and a second voltage ($V_2$). Voltage converter 800 may convert $V_{IN}$ to a voltage between $V_1$ and $V_2$ and provide the converted voltage as an output voltage ($V_{OUT}$). Such a converter may be used as a DC—DC converter and may be able to convert an input voltage to a higher voltage or a lower voltage. Additionally, such a DC—DC converter may provide a plurality of level shifted outputs with the addition of more cascode stages and more voltage inputs. Additionally, some embodiments may provide fixed conversion levels while other embodiments may provide variable conversion levels by adjusting voltages $V_1$ and $V_2$.

Figure 9:
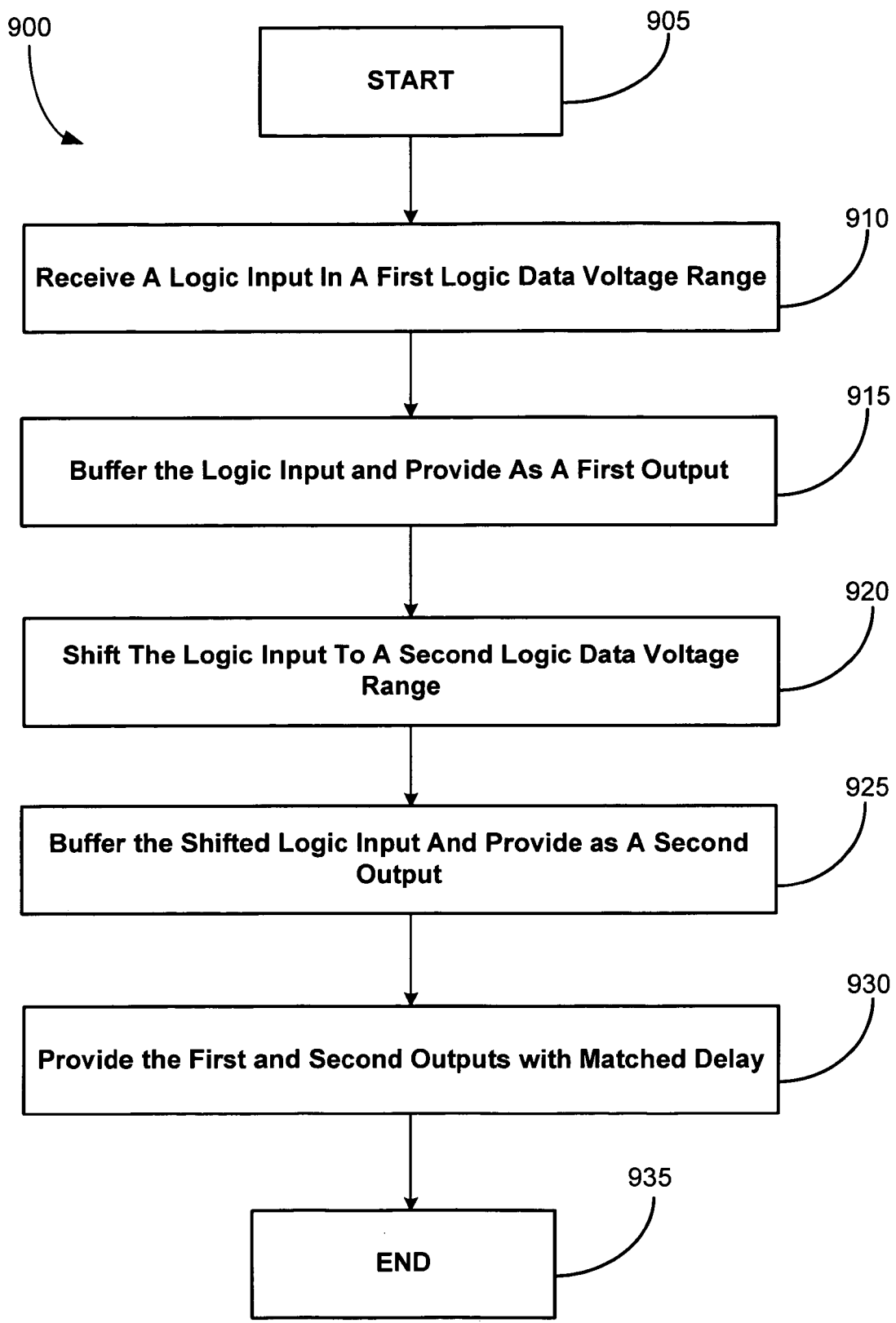
FIG. 9 illustrates a logic flow diagram of a method of shifting voltages in accordance with some embodiments of the present invention.

FIG. 9 illustrates a logic flow diagram of a method 900 to shift voltages in accordance with an embodiment of the present invention. Method 900 may start at 905 and receive a logic input having a first logic voltage at 910. The first logic voltage may be in a first data voltage range bounded by a reference voltage and a first voltage and a predetermined threshold within the range may determine if the logic input is a digital high or low. At 915, the logic input may be buffered and provided as a first output. At 920, the logic input may be shifted to a second logic voltage. The second logic voltage may be in a second data voltage range bounded by the first voltage and a second voltage and a predetermined threshold within the range may determine if the second logic voltage is a digital high or low. Next at 925, the shifted logic input may be provided as a second output. At 930, the first and second outputs may be provided with matched delay and the method may end at 935

The many method embodiments of the present invention may comprise various shift-up and shift-down embodiments and method 900 is only one embodiment of the many such possible embodiments. For example, a method may comprise injecting current in a level shifter circuit with a current injector, or utilizing at least one booster capacitor to provide a level shifter with a quick response time. Also, method 900 may be performed in a different order than discussed above and the order may depend on the specific implementation of the numerous level shifter embodiments. Additionally, some method embodiments may be DC—DC voltage conversion methods where a DC input voltage is shifted and provided as a DC output.

Most of the various level shifter embodiments discussed above are shift-up level shifters. Shift-down level shifters are also possible in accordance with some embodiments of the present invention. Each shift-up level shifter has a complementary shift-down level shifter existing for each of the above discussed level shifter embodiments. For example, some embodiments of the present invention may receive a low input (d=0 and /d=1) in a first data voltage range bounded by $3V_{cc}$ and $2V_{cc}$, produce a first-level-shifted output $y_1$ which may be a logic low in a second data voltage range bounded by $V_{cc}$ and $2V_{cc}$, and produce a second-level-shifted output $y_2$ which may be a logic low in a third data voltage range bounded by 0 volts and Vcc. Some embodiments of the present invention may utilize transistors rated for a maximum voltage of $V_{cc}$, and may support higher voltages since the gate-source or drain-source voltages of any of the transistors may never exceed $V_{cc}$. These embodiments and the other embodiments of the present invention may also be used in system and method embodiments.

The various embodiments of the present invention have been described with reference to the above discussed embodiments, but the present invention should not be construed to cover only these embodiments. Rather, these embodiments are only exemplary embodiments. Variations of the above exemplary embodiments may suggest themselves to those skilled in the art or others without departing from the spirit and scope of the present invention. The appended claims and their full range of equivalents should, therefore, only define the full scope of the present invention.

We claim:

1. A device comprising:
   an input stage to receive a logic input and a reference voltage;
   a cascode stage to receive a first voltage and connected to the input stage;
   an output stage to receive a second voltage, to provide an output, and connected to the cascode stage, wherein the cascode stage is adapted to set the first voltage as the output when the logic input is a first value and set the second voltage as the output when the logic input is a second value; and
   a buffer stage adapted to receive the reference voltage, first voltage, second voltage, the output, and the logic input, and to provide a buffered output and a buffered logic input.

2. The device of claim 1 further comprising a pair of capacitors connected in parallel with the cascode stage to increase the response time of the cascode stage.

3. The device of claim 1 wherein the input stage comprises a pair of inverters connected to the cascode stage to provide the cascode stage with the logic input and a complement of the logic input.

4. The device of claim 1 wherein the input stage comprises two logic gates each having three terminals and an inverter having two terminals, wherein:
   the first terminal of the first logic gate is connected to the logic input and the first terminal of the inverter, the second terminal of the first logic gate is connected to the third terminal of the second logic gate, and the third terminal of the first logic gate is connected to the cascode stage; and
   the first terminal of the second logic gate is connected to the third terminal of the first logic gate, the second terminal of the logic gate is connected to the second terminal of the inverter, and the third terminal of the second logic gate is connected to the cascode stage.

5. The device of claim 1, further comprising two transistors and two logic gates, each having three terminals wherein:
   the first terminal of the first transistor is connected to the first terminal of the first logic gate, the second terminal of the first transistor is connected to the third terminal of the first logic gate, and the third terminal of the first transistor is connected to the first voltage;
   the first terminal of the first logic gate is connected to the output stage, the second terminal of the first logic gate is connected to the third terminal of the second logic gate, and the third terminal of the first logic gate provides a buffered output;
   the first terminal of the second transistor is connected to the first terminal of the second logic gate, the second terminal of the second transistor is connected to the third terminal of the second logic gate, and the third terminal of the second transistor is connected to the first voltage; and;
   the first terminal of the second logic gate is connected to the output stage, the second terminal of the second logic gate is connected to the third terminal of the first logic gate, and the third terminal of the second logic gate provides a buffered complement of the output.

6. The device of claim 1, wherein the device is a voltage converter adapted to convert the logic input having an input voltage to the output having an output voltage, wherein the cascode stage and the output stage are adapted to convert the input voltage to the output voltage, the output voltage being between the first voltage and the second voltage.

7. A device comprising:
   an input stage to receive a logic input and a reference voltage, and to provide a first output;
   a first cascode stage to receive a first voltage and connected to the input stage;
   a second cascode stage to receive a second voltage and connected to the first cascode stage;
   a first cross-coupled stage adapted to provide a second output and connected to the first cascode stage;
   a second cross-coupled stage adapted to receive a third voltage and to provide a third output, wherein the second cross-coupled stage is connected to the second cascode stage;
   and wherein the first cascode stage is adapted to set the first voltage as the second output when the logic input is a first value and set the second voltage as the second output when the logic input is a second value, and wherein the second cascode stage is adapted to set the second voltage as the third output when the logic input is the first value and set the third voltage as the third output when the logic input is the second value.

8. The device of claim 7 further comprising a buffer output stage adapted to receive the first, second, and third outputs and buffer the first, second, and third outputs.

9. The device of claim 8, the buffer output stage comprising six inverters each having two terminals, wherein:
   the first terminal of the first inverter receives a complement of one of the first, second, or third outputs and the second terminal of the first inverter is connected to the first terminal of the third inverter and fourth inverter;
   the first terminal of the second inverter receives one of the first, second, or third outputs and the second terminal of the second inverter is connected to the second terminal of the third inverter and fourth inverter;
   the first terminal of the fifth inverter is connected to the first terminal of the third inverter and fourth inverter and the second terminal of the fifth inverter provides a buffered output; and
   the first terminal of the sixth inverter is connected to the first terminal of the third inverter and fourth inverter and the second terminal of the sixth inverter provides a complement of the buffered output.

10. The device of claim 9 further comprising a first capacitor having two terminals, wherein the first terminal is connected to the input stage and the second terminal is connected to the first cross coupled stage.

11. The device of claim 10 further comprising a second capacitor having two terminals, wherein the first terminal of the second capacitor is connected to the second cross coupled stage and the second terminal of the second capacitor is connected to the first terminal of the first capacitor.

12. The device of claim 7 wherein the second and third voltages are multiples of the first voltage.

13. The device of claim 7 further comprising a current injector connected in parallel with the second cross-coupled stage.

14. The device of claim 13 wherein the current injector comprises four transistors each having three terminals wherein:

the first and second terminals of the first transistor receive a first voltage and the third terminal of the first transistor is connected to the first and second terminals of the second transistor;

the third terminal of the second transistor receives a second voltage and the second terminal of the second transistor is connected to the second terminal of the third and fourth transistor;

the third terminal of the third transistor receives the second voltage and the first terminal of the third transistor provides a first current; and the third terminal of the fourth transistor receives the second voltage and the first terminal of the fourth transistor provides a second current.

15. A system comprising:

a logic device having a level shifter to receive a logic input in a first data voltage range and adapted to shift the logic input to a second data voltage range, the level shifter comprising:

an input stage to receive the logic input, a complement of the logic input, and a reference voltage;

a cascode stage to receive a first voltage and connected to the input stage;

a cross-coupled stage adapted to isolate the first voltage and connected to the cascode stage; and an output stage to receive a second voltage, to provide an output, and connected to the cross-coupled stage, wherein the cascode stage is adapted to set the first voltage as the output when the logic input is a first value and set the second voltage as the output when the logic input is a second value; and a wireless network interface coupled to the logic device adapted to receive and transmit wireless signals.

16. The system of claim 15 wherein the reference and first voltages bound the first data voltage range and the first and second voltages bound the second data voltage range.

17. The system of claim 15 wherein the reference voltage is ground and the second voltage is a multiple of the first voltage.

18. The system of claim 15 wherein the level shifter is adapted to shift the logic input to a third data voltage range bounded by the second voltage and a third voltage.

19. The system of claim 15 further comprising a second logic device having a second level shifter to receive the output and shift the output to a third data voltage range, wherein the second logic device is coupled to the logic device and adapted to operate in the third data voltage range.

20. A method comprising:

receiving a logic input having a first logic voltage;

providing the first logic voltage as an output when the logic input is a first value; and shifting the logic input to a second logic voltage and providing the second logic voltage as the output when the logic input is a second value; and wherein the first logic voltage is between a reference voltage and a first voltage, and the second logic voltage is between the first voltage and a second voltage, wherein the reference voltage is ground and the second voltage is a multiple of the first voltage.

21. The method of claim 20, further comprising:

shifting the logic input to a third logic voltage;

providing the second logic voltage as a second output when the logic input is the first value; and providing the third logic voltage as the second output when the logic input is the second value.

22. The method of claim 21, wherein the third logic voltage is between the second voltage and a third voltage, and the third voltage is a multiple of the first voltage.

23. The method of claim 20 further comprising buffering the logic input and the output and providing the buffered logic input and buffered output as match delay outputs.

* * * * *